(12) United States Patent
Yuan et al.

(10) Patent No.: US 12,295,151 B2
(45) Date of Patent: May 6, 2025

(54) SEMICONDUCTOR STRUCTURE AND MANUFACTURING METHOD THEREOF (71) Applicant: CHANGXIN MEMORY TECHNOLOGIES, INC., Hefei (CN)

(72) Inventors: Pan Yuan, Hefei (CN); Xingsong Su, Hefei (CN); Qiang Zhang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 513 days.

(21) Appl. No.: 17/648,350

(22) Filed: Jan. 19, 2022

(65) Prior Publication Data
US 2022/0293720 A1 Sep. 15, 2022

Related U.S. Application Data (63) Continuation of application No. PCT/CN2021/109969, filed on Aug. 2, 2021.

(30) Foreign Application Priority Data

Mar. 9, 2021 (CN) .......................... 202110258253.9

(51) Int. Cl.
*H10D 1/68* (2025.01)
*H01G 4/10* (2006.01)
(Continued)

(52) U.S. Cl.
CPC .............. *H10D 1/696* (2025.01); *H01G 4/10* (2013.01); *H10D 1/042* (2025.01); *H10D 1/694* (2025.01);
(Continued)

(58) Field of Classification Search
CPC ......... H01L 28/75; H01L 28/65; H01L 28/91; H01G 4/10; H01G 4/005; H01G 4/01;
(Continued)

(56) References Cited

U.S. PATENT DOCUMENTS 4,437,139 A 3/1984 Howard
10,453,913 B2 10/2019 Cho et al.
(Continued)

FOREIGN PATENT DOCUMENTS

CN 1988078 A 6/2007
CN 108336068 A 7/2018
(Continued)

OTHER PUBLICATIONS

First Office Action cited in CN Application No. 202110258253.9, mailed Mar. 8, 2022, 20 pages.
(Continued)

*Primary Examiner* — Patricia D Valenzuela
(74) *Attorney, Agent, or Firm* — Kilpatrick Townsend & Stockton LLP (57) ABSTRACT

Embodiments of the present disclosure provide a semiconductor structure and a manufacturing method thereof. The manufacturing method includes: providing a base; forming a bottom electrode layer on the base, wherein a crystal structure of the bottom electrode layer includes a tetragonal crystal system; forming a first dielectric layer on a surface of the bottom electrode layer by using the bottom electrode layer as a seed layer, wherein a crystal structure of the first dielectric layer includes a tetragonal crystal system; and forming a first current blocking layer on a surface of the first dielectric layer.

10 Claims, 5 Drawing Sheets

(51) Int. Cl.
*H10D 1/00* (2025.01)
*H10B 12/00* (2023.01)

(52) U.S. Cl.
CPC .............. *H10D 1/716* (2025.01); *H10B 12/30* (2023.02); *H10D 1/68* (2025.01)

(58) Field of Classification Search
CPC ........ H01G 4/1272; H01G 4/33; H01G 4/385; H10D 1/696; H10D 1/042; H10D 1/694; H10D 1/716; H10D 1/68; H10H 20/814; A23B 11/164; F27D 17/28; H02K 15/0434; H10B 12/30
See application file for complete search history.

(56) References Cited

U.S. PATENT DOCUMENTS

| | | | |
|---|---|---|---|
| 10,825,893 | B2 | 11/2020 | Cho et al. |
| 10,892,345 | B2 | 1/2021 | Moon et al. |
| 2007/0004154 | A1 | 1/2007 | Hong et al. |
| 2007/0096180 | A1 | 5/2007 | Yamakawa et al. |
| 2008/0203529 | A1 | 8/2008 | Kang et al. |
| 2013/0058007 | A1 | 3/2013 | Park |
| 2014/0077336 | A1 | 3/2014 | Chiang et al. |
| 2014/0080282 | A1 | 3/2014 | Chiang et al. |
| 2017/0004967 | A1 | 1/2017 | Kil et al. |
| 2020/0321474 | A1* | 10/2020 | Ramamoorthy .. H01L 29/78618 |
| 2020/0395438 | A1 | 12/2020 | Kang et al. |
| 2021/0066066 | A1 | 3/2021 | Lee et al. |
| 2021/0142946 | A1* | 5/2021 | Kang ..................... H01L 28/40 |

FOREIGN PATENT DOCUMENTS

| | | |
|---|---|---|
| CN | 108511424 A | 9/2018 |
| CN | 108807345 A | 11/2018 |
| CN | 109216328 A | 1/2019 |
| CN | 109841622 A | 6/2019 |
| CN | 110993603 A | 4/2020 |
| CN | 111900149 A | 11/2020 |
| CN | 112447719 A | 3/2021 |
| CN | 113054105 A | 6/2021 |
| JP | 2007088147 A | 4/2007 |

OTHER PUBLICATIONS

International Search Report cited in PCT/CN2021/109969 mailed Dec. 1, 2021, 10 pages.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2021/109969, filed on Aug. 2, 2021, which claims the priority to Chinese Patent Application No. 202110258253.9, titled "SEMICONDUCTOR STRUCTURE AND MANUFACTURING METHOD THEREOF" and filed with China National Intellectual Property Administration on Mar. 9, 2021. The entire contents of International Application No. PCT/CN2021/109969 and Chinese Patent Application No. 202110258253.9 are incorporated herein by reference.

TECHNICAL FIELD

The present disclosure relates to, but is not limited to, a semiconductor structure and a manufacturing method thereof.

BACKGROUND

With the development of the capacitor in the semiconductor structure toward miniaturization and high performance, the capacitor needs to have a high capacitance in a small size. At present, to increase the capacitance of the capacitor, it is usually necessary to increase the dielectric constant of the material of the dielectric layer in the capacitor.

However, the dielectric constant of the material of the dielectric layer is related to the crystal structure of the material itself. How to increase the dielectric constant of the material of the dielectric layer without changing the material of the dielectric layer has become an urgent problem to be solved.

SUMMARY

An overview of the subject matter detailed in the present disclosure is provided below, which is not intended to limit the protection scope of the claims.

Embodiments of the present disclosure further provide a semiconductor structure and a manufacturing method thereof.

Embodiments of the present disclosure provide a method of manufacturing a semiconductor structure, including: providing a base; forming a bottom electrode layer on the base, wherein a crystal structure of the bottom electrode layer includes a tetragonal crystal system; forming a first dielectric layer on a surface of the bottom electrode layer by using the bottom electrode layer as a seed layer, wherein a crystal structure of the first dielectric layer includes a tetragonal crystal system; and forming a first current blocking layer on a surface of the first dielectric layer.

Embodiments of the present disclosure further provide a semiconductor structure, including: a base; a bottom electrode layer, wherein the bottom electrode layer is located on the base, and a crystal structure of the bottom electrode layer includes a tetragonal crystal system; a first dielectric layer, wherein the first dielectric layer is located on a surface of the bottom electrode layer, and a crystal structure of the first dielectric layer includes a tetragonal crystal system; and a first current blocking layer, wherein the first current blocking layer is located on a surface of the first dielectric layer.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

As mentioned in the background, the capacitance of the capacitor in the semiconductor structure needs to be increased, and the dielectric constant of the dielectric layer in the capacitor needs to be increased.

To increase the capacitance of the capacitor in the semiconductor structure, it is usually necessary to use a material with a high dielectric constant to make the dielectric layer. For most materials used to form the dielectric layer, if the crystal structure of the material has a tetragonal crystal system, the tetragonal crystal system has a higher dielectric constant than a low-class crystal system. However, most of the materials used to form the dielectric layer require an annealing process to transform the crystal structure of the dielectric layer into a tetragonal crystal system, which complicates the process for manufacturing the capacitor.

A seed layer is formed in the dielectric layer to promote the transformation of the crystal structure of the dielectric layer to a tetragonal crystal system. However, the presence of the seed layer in the dielectric layer increases the overall thickness of the dielectric layer, which reduces the capacitance of the formed capacitor, thereby hindering the formation of a small-sized capacitor.

Embodiments of the present disclosure provide a semiconductor structure and a manufacturing method thereof. In the present disclosure, a crystal structure of a bottom electrode layer has a tetragonal crystal system, and the bottom electrode layer serves as a seed layer to form a first dielectric layer, such that a crystal structure of the first dielectric layer also has a tetragonal crystal system. The present disclosure can form a first dielectric layer with a higher dielectric constant without changing the material of the first dielectric layer, so as to increase the capacitance of a capacitor in the semiconductor structure, thereby improving the electrical performance of the semiconductor structure. In addition, the present disclosure does not require an annealing process to form the first dielectric layer with a tetragonal crystal structure, thereby simplifying the manufacturing the first dielectric layer.

The embodiments of the present disclosure are described in detail below with reference to the drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 1:
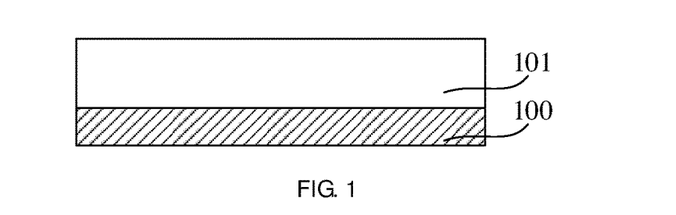
FIG. 1 is a partial sectional view illustrating a structure obtained by forming a bottom electrode layer on a base according to a first embodiment of the present disclosure.
Figure 2:
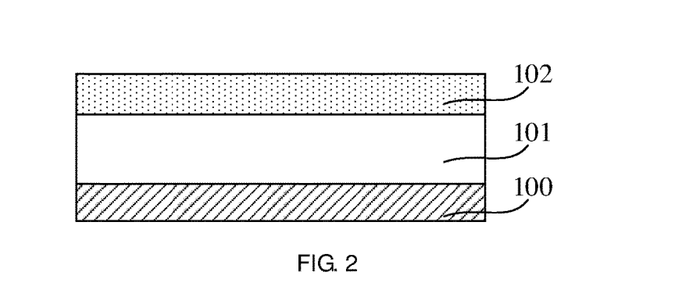
FIG. 2 is a partial sectional view illustrating a structure obtained by forming a first dielectric layer on a surface of the bottom electrode layer according to the first embodiment of the present disclosure.
Figure 3:
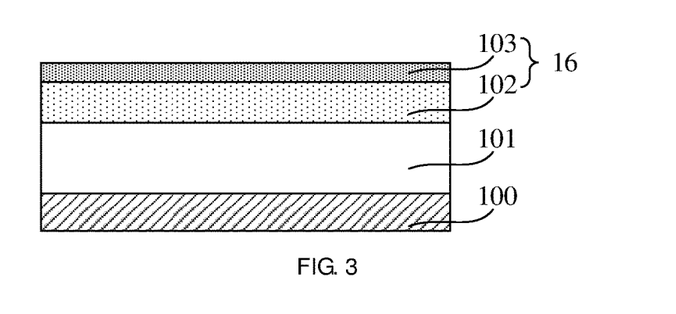
FIG. 3 is a partial sectional view illustrating a structure obtained by forming a first current blocking layer on a surface of the first dielectric layer according to the first embodiment of the present disclosure.

FIGS. 1 to 7 are partial sectional views illustrating structures obtained by implementing a method of manufacturing a semiconductor structure according to a first embodiment of the present disclosure. FIG. 3 is a sectional view of a region I in FIG. 7.

Referring to FIG. 1, a base 100 is provided, and a bottom electrode layer 101 is formed on the base 100.

In this embodiment, a crystal structure of the bottom electrode layer 101 has a tetragonal crystal system, which serves as a seed layer for forming a first dielectric layer subsequently. Since there is no need to additionally form a seed layer in the first dielectric layer, the thickness of the first dielectric layer is reduced, thereby increasing the capacitance of a capacitor to be formed subsequently and realizing the miniaturization of the capacitor.

The material of the bottom electrode layer 101 includes at least one of ruthenium oxide and iridium oxide. By using ruthenium oxide and iridium oxide to make the bottom electrode layer 101, the bottom electrode layer 101 with a tetragonal crystal structure is formed without an annealing process, thereby simplifying the manufacturing the bottom electrode layer 101.

The bottom electrode layer 101 is formed by an atomic layer deposition (ALD) process, a chemical vapor deposition (CVD) process or a physical vapor deposition (PVD) process. In an example, the bottom electrode layer 101 is formed by the ALD process. The ALD process can deposit a substance layer by layer on a surface of the base 100 in the form of a monatomic film. Therefore, when the bottom electrode layer 101 is formed by the ALD process, the atoms in the bottom electrode layer 101 are repeatedly and regularly arranged to ensure that the crystal structure of the bottom electrode layer 101 is tetragonal. A temperature parameter of the ALD process is 280° C.-400° C., which facilitates the formation of the bottom electrode layer 101 with a high density and high strength. In addition, in a direction perpendicular to the surface of the base 100, the thickness of the bottom electrode layer 101 is 1-30 nm, for example, 5 nm, 15 nm or 25 nm.

Referring to FIG. 2, a first dielectric layer 102 is formed on a surface of the bottom electrode layer 101 by using the bottom electrode layer 101 as a seed layer.

In this embodiment, the first dielectric layer 102 is formed by an epitaxial process. Since the epitaxial process facilitates the formation of the first dielectric layer 102 with the same crystal structure as the bottom electrode layer 101, the first dielectric layer 102 with a tetragonal crystal structure can be formed without using an annealing process. This simplifies the manufacturing the first dielectric layer 102. In the direction perpendicular to the surface of the base 100, the thickness of the first dielectric layer 102 is 0.1-10 nm, for example, 0.5 nm, 4 nm or 8 nm.

In an example, a material of the first dielectric layer 102 is hafnium oxide, and a process temperature of the epitaxial process is 250° C.-600° C. The dielectric constant of hafnium oxide with a monoclinic crystal structure is 20-25, and the dielectric constant of hafnium oxide with a tetragonal crystal structure is 40-60. By using the bottom electrode layer 101 with a tetragonal crystal structure as a seed layer, the first dielectric layer 102 with a tetragonal crystal structure is formed on the surface of the bottom electrode layer 101 by an epitaxial process. This improves the dielectric constant of the first dielectric layer 102 without changing the material of the first dielectric layer 102. A dielectric layer of the capacitor formed subsequently includes the first dielectric layer 102, which increases the capacitance of the capacitor.

In other embodiments, a material of the first dielectric layer 102 includes at least one of dielectric materials of tantalum oxide, hafnium oxide, zirconium oxide, niobium oxide, titanium oxide, barium oxide, strontium oxide, yttrium oxide, lanthanum oxide, praseodymium oxide or barium strontium titanate.

Referring to FIG. 3, after the first dielectric layer 102 is formed, the manufacturing method further includes: form a first current blocking layer 103 on a surface of the first dielectric layer 102. In the direction perpendicular to the surface of the base 100, the thickness of the first current blocking layer 103 is 0.1-5 nm, for example, 0.5 nm, 2 nm or 4 nm.

The material of the first current blocking layer 103 includes at least one of the group consisting of aluminum oxide, silicon oxide and silicon nitride. The aluminum oxide, silicon oxide and silicon nitride are all high-bandgap materials. That is, there is a large energy difference between the lowest point of a conduction band and the highest point of a valence band in the first current blocking layer 103, and it is hard for electrons to be excited from the valence band to the conduction band. Therefore, the first current blocking layer 103 is of low conductivity. The dielectric layer of the subsequently formed capacitor includes the first current blocking layer 103, which increases the dielectric constant of the capacitor and reduces the leakage current in the capacitor so as to increase the capacitance of the capacitor, thereby improving the electrical performance of the semiconductor structure.

The first current blocking layer 103 is formed by an ALD process, a CVD process or a PVD process, and a process temperature of forming the first current blocking layer 103 is 200° C.-700° C. In an example, the first current blocking layer 103 is made of aluminum oxide, and the first current blocking layer 103 is formed by an ALD process, and a process temperature of the ALD process is 200° C.-700° C. In this way, the first current blocking layer 103 has a desirable suppression effect on the leakage current in the first dielectric layer 102, thereby improving the electrical performance of the capacitor to be subsequently formed.

In this embodiment, after the first current blocking layer is formed, a top electrode layer may be directly formed on the first current blocking layer to form the capacitor. In other embodiments, after the first current blocking layer is formed, the dielectric layer may be formed on the first current blocking layer, and then the top electrode layer may be directly formed on the dielectric layer to form the capacitor.

Figure 4:
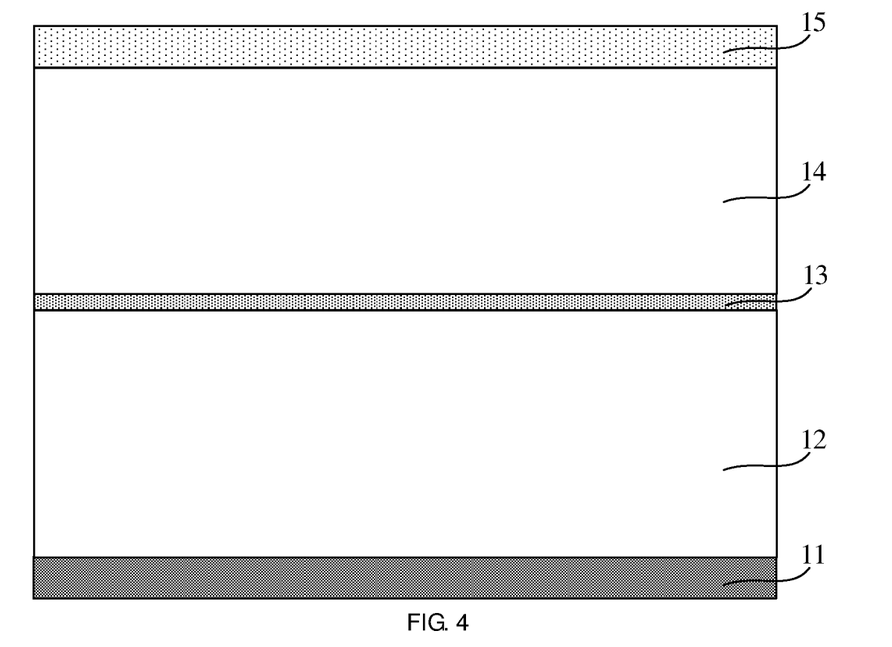
FIG. 4 is a partial sectional view illustrating a structure obtained by forming a first sacrificial layer, an intermediate support layer, a second sacrificial layer and a top support layer sequentially stacked on a substrate according to the first embodiment of the present disclosure.

In this embodiment, referring to FIGS. 4 to 7, providing the base 100 and forming the bottom electrode layer 101 on the base 100 include:

Referring to FIG. 4, a substrate 11 is provided, and a first sacrificial layer 12, an intermediate support layer 13, a second sacrificial layer 14 and a top support layer 15 sequentially stacked on the substrate 11 are formed.

Figure 5:
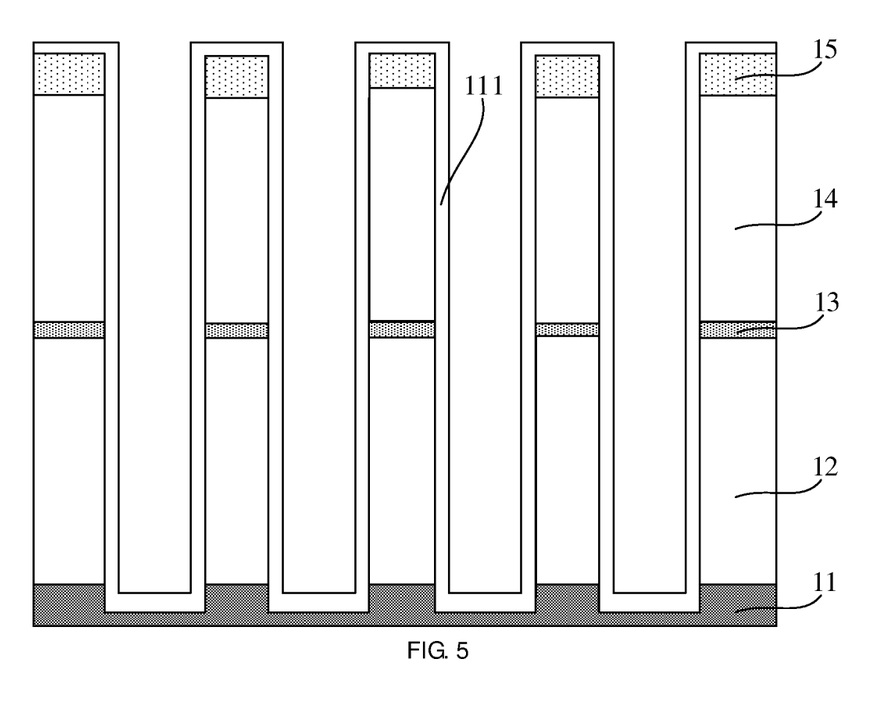
FIG. 5 is a partial sectional view illustrating a structure obtained by forming a base bottom electrode layer on the bottom and a sidewall of a capacitor hole according to the first embodiment of the present disclosure.

Referring to FIG. 5, the top support layer 15, the second sacrificial layer 14, the intermediate support layer 13, the first sacrificial layer 12 and the substrate 11 are patterned to form a capacitor hole, the capacitor hole penetrating the top support layer 15, the second sacrificial layer 14, the intermediate support layer 13, the first sacrificial layer 12 and part of the substrate 11, wherein the capacitor hole exposes the substrate 11.

A base bottom electrode layer 111 is formed on the bottom and a sidewall of the capacitor hole.

Figure 6:
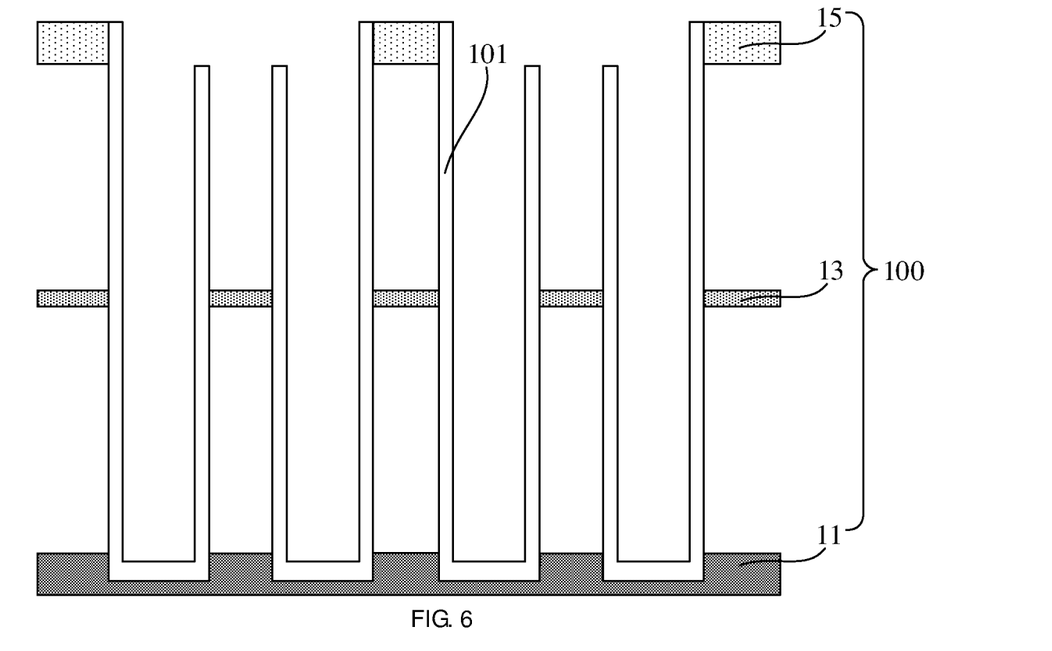
FIG. 6 is a partial sectional view illustrating a structure obtained by providing the base and forming the bottom electrode layer on the base according to the first embodiment of the present disclosure.

Referring to FIGS. 5 and 6, part of the top support layer 15, part of the intermediate support layer 13, part of the base bottom electrode layer 111, the first sacrificial layer 12 and the second sacrificial layer 14 are removed to form the base 100 and the bottom electrode layer 101 on the base 100.

The first sacrificial layer 12 and the second sacrificial layer 14 are completely removed to expose an outer surface of the bottom electrode layer 101, so as to facilitate the subsequent formation of the first dielectric layer on the surface of the bottom electrode layer 101.

FIG. 6 is a partial sectional view of the semiconductor structure, and FIG. 6 does not show the part of the top support layer 15 and the part of the intermediate support layer 13 that are removed. FIG. 6 only actually illustrates one type of base 100. In fact, there may be more types of bases for forming the bottom electrode layer on the base, so as to facilitate the subsequent formation of the capacitor on the base.

Figure 7:
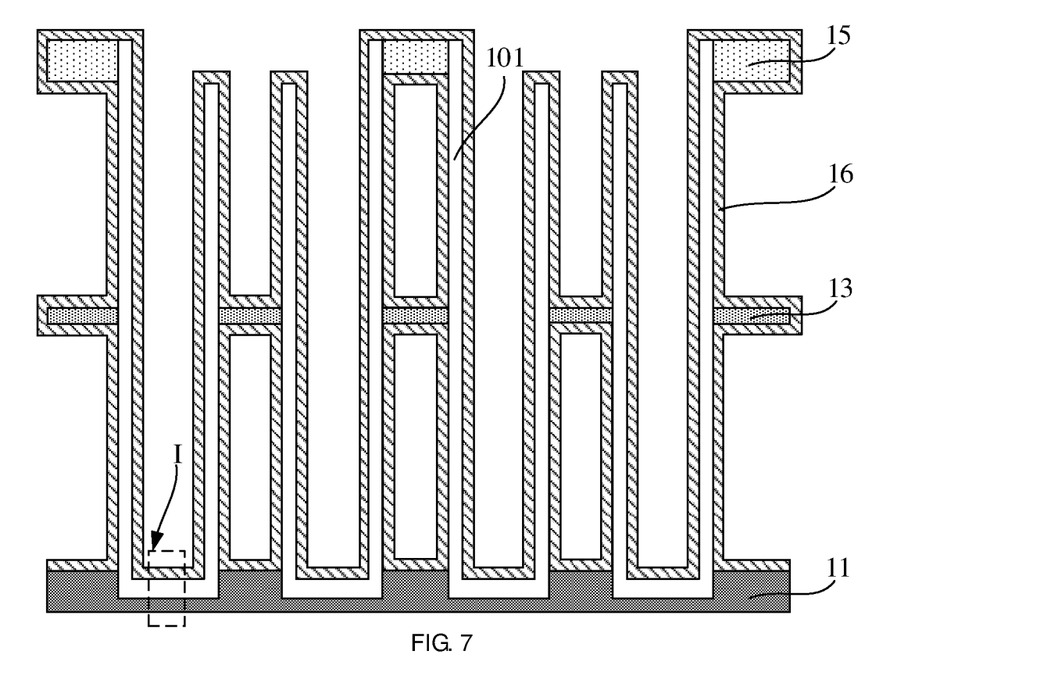
FIG. 7 is a partial sectional view illustrating a structure obtained by forming a dielectric layer on the surface of the bottom electrode layer according to the first embodiment of the present disclosure.

Referring to FIG. 7, a dielectric layer 16 is formed on the surface of the bottom electrode layer 101. In this embodiment, the dielectric layer 16 includes the first dielectric layer 102 (refer to FIG. 3) and the first current blocking layer 103 (refer to FIG. 3) formed as described above. The forming the first dielectric layer 102 on the surface of the bottom electrode layer 101 includes: conformally cover the first dielectric layer 102 on a surface of a structure formed by the bottom electrode layer 101, the intermediate support layer 13 and the top support layer 15, and conformally cover the first current blocking layer 103 on the surface of the first dielectric layer 102.

In this embodiment, the first dielectric layer 102 is formed by using the bottom electrode layer 101 as a seed layer, such that the crystal structure of the first dielectric layer 102 is also tetragonal, which facilitates the formation of the first dielectric layer 102 with a higher dielectric constant. The dielectric layer of the capacitor formed subsequently includes at least the first dielectric layer 102, which increases the capacitance of the capacitor, thereby improving the electrical performance of the semiconductor structure. In addition, the first current blocking layer 103 may be formed on an upper surface of the first dielectric layer 102, so as to reduce the leakage current in the first dielectric layer 102 and further improve the electrical performance of the semiconductor structure.

A second embodiment of the present disclosure further provides a method of manufacturing a semiconductor structure. The method of manufacturing a semiconductor structure provided by the second embodiment of the present disclosure is described in detail below with reference to the drawings. The parts the same as or corresponding to those mentioned in the previous embodiment may be referred to the previous embodiment and will not be repeated here.

Figure 8:
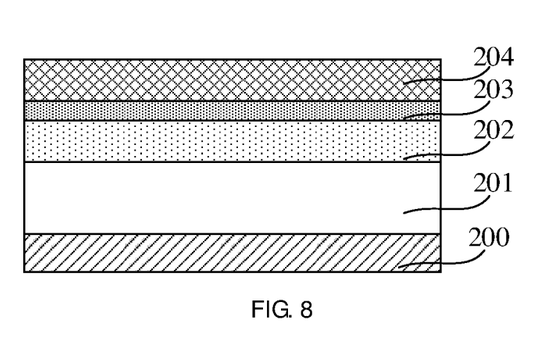
FIG. 8 is a partial sectional view illustrating a structure obtained by forming a second dielectric layer on a surface of a first current blocking layer according to a second embodiment of the present disclosure.
Figure 9:
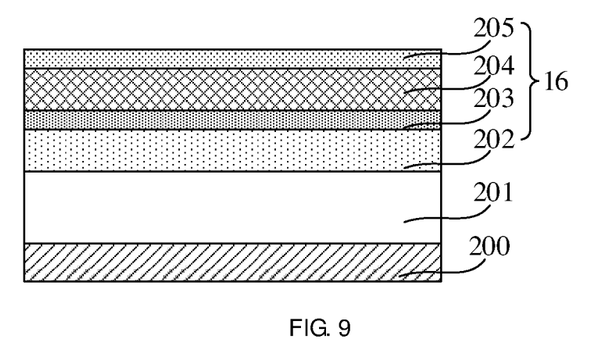
FIG. 9 is a partial sectional view illustrating a structure obtained by depositing a second current blocking layer on a surface of the second dielectric layer according to the second embodiment of the present disclosure.

FIGS. 8 to 9 are partial sectional views illustrating structures obtained by implementing a method of manufacturing a semiconductor structure according to the second embodiment of the present disclosure. It should be noted that FIG. 9 is a sectional view of a region I in FIG. 7.

Referring to FIG. 8, a bottom electrode layer 201, a first dielectric layer 202 and a first current blocking layer 203 are sequentially formed on a base 200, and then a second dielectric layer 204 is formed on a surface of the first current blocking layer 203. The first current blocking layer 203 can reduce the leakage current in the first dielectric layer 202, and a dielectric layer of a capacitor to be formed subsequently includes the first current blocking layer 203, thereby improving the electrical performance of the capacitor.

In this embodiment, the first current blocking layer 203 and the second dielectric layer 204 are formed by an ALD process. In a direction perpendicular to a surface of the base 200, the thickness of the first current blocking layer 203 is 0.1-5 nm, for example, 0.5 nm, 2 nm or 4 nm; and the thickness of the second dielectric layer 204 is 0.1-10 nm, for example, 0.5 nm, 4 nm or 8 nm.

Referring to FIG. 9, a second current blocking layer 205 is deposited on a surface of the second dielectric layer 204, and a temperature of the depositing is greater than or equal to the crystallization temperature for a crystal structure of the second dielectric layer 204 to be transformed into a tetragonal crystal system.

The deposition temperature of the second current blocking layer 205 is greater than or equal to the crystallization temperature for the crystal structure in the second dielectric layer 204 to be transformed into a tetragonal crystal system. Therefore, after forming the second current blocking layer 205, the crystal structure of the second dielectric layer 204 is transformed into a tetragonal crystal system. There is no need to form the second dielectric layer 204 with a tetragonal crystal structure through an additional annealing process, which simplifies the manufacturing the second dielectric layer 204. Meanwhile, the crystal structure of the second dielectric layer 204 is tetragonal, which has a higher dielectric constant than a low-class crystal system. Therefore, the dielectric constant of the second dielectric layer 204 can be increased without changing the material of the second dielectric layer 204. The dielectric layer of the subsequently formed capacitor includes at least the first dielectric layer 202 and the second dielectric layer 204, which increases the capacitance of the capacitor.

In addition, the material of the second current blocking layer 205 includes at least one of the group consisting of aluminum oxide, silicon oxide and silicon nitride. The material used reduces the leakage current in the first dielectric layer 202 and the second dielectric layer 204, so as to further increase the capacitance of the capacitor, thereby improving the electrical performance of the semiconductor structure.

The second current blocking layer 205 is formed by an ALD process, a CVD process or a PVD process, and a process temperature of depositing the second current blocking layer 205 is 200° C.-700° C.

In an example, the second dielectric layer 204 is made of zirconium oxide. In the direction perpendicular to the surface of the base 200, the thickness of the second dielectric layer 204 is 0.1-10 nm, for example, 2 nm or 5 nm. The second current blocking layer 205 is formed by an ALD process, and a process temperature of the ALD process is 200° C.-700° C., for example, 330° C. The second current blocking layer 205 is made of aluminum oxide. In the process of forming the second current blocking layer 205, the crystal structure of the second dielectric layer 204 is transformed into a tetragonal crystal system. Therefore, after forming the second current blocking layer 205, the material of the second dielectric layer 204 is tetragonal zirconium oxide.

In this embodiment, after forming the second current blocking layer, a top electrode layer may be directly formed on the second current blocking layer to form the capacitor. In other embodiments, after forming the second current blocking layer, the dielectric layer may be formed on the second current blocking layer, and then the top electrode layer may be directly formed on the dielectric layer to form the capacitor.

In this embodiment, when the second current blocking layer 205 is formed, the crystal structure of the second dielectric layer 204 is transformed into a tetragonal crystal system, without the need to perform an additional annealing process on the second dielectric layer 204. This increases the dielectric constant of the second dielectric layer 204, increases the capacitance of the capacitor, and simplifies the manufacturing the second dielectric layer 204. In addition, the second current blocking layer 205 can reduce the leakage current in the first dielectric layer 202 and the second dielectric layer 204, so as to further improve the electrical performance of the semiconductor structure. Further, the dielectric layer 16 in the capacitor has a stacked structure, that is, the dielectric layer 16 includes at least the first dielectric layer 202 and the second dielectric layer 204, which improves the structural stability of the capacitor.

A third embodiment of the present disclosure further provides a method of manufacturing a semiconductor structure. The method of manufacturing a semiconductor structure provided by the third embodiment of the present disclosure is described in detail below with reference to the drawings. The parts the same as or corresponding to those mentioned in the previous embodiment may be referred to the previous embodiment and will not be repeated here.

Figure 10:
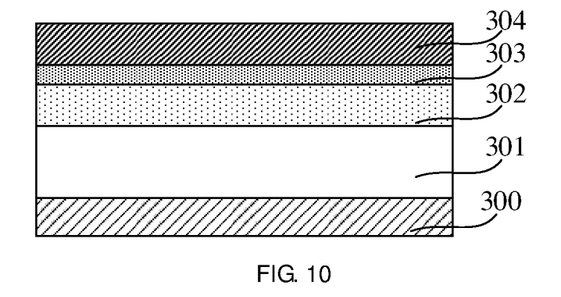
FIG. 10 is a partial sectional view illustrating a structure obtained by forming a second dielectric layer on a first current blocking layer according to a third embodiment of the present disclosure.
Figure 11:
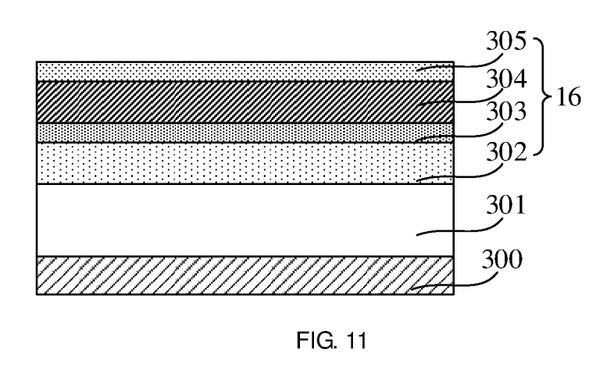
FIG. 11 is a partial sectional view illustrating a structure obtained by depositing a second current blocking layer on a surface of the second dielectric layer according to the third embodiment of the present disclosure.

FIGS. 10 and 11 are partial sectional views illustrating structures obtained by implementing a method of manufacturing a semiconductor structure according to the third embodiment of the present disclosure. FIGS. 10 and 11 are two sectional views of a region I in FIG. 7.

Referring to FIG. 10, a bottom electrode layer 301, a first dielectric layer 302 and a first current blocking layer 303 are sequentially formed on a base 300, and then a second dielectric layer 304 is formed on the first current blocking layer 303. The dielectric constant of the material of the second dielectric layer 304 is greater than the dielectric constant of the material of the first dielectric layer 302. In a direction perpendicular to a surface of the base 300, the thickness of the second dielectric layer 304 is 0.1-10 nm, for example, 0.5 nm, 4 nm or 8 nm.

In an example, referring to FIG. 10, a dielectric layer 16 (refer to FIG. 7) includes the first dielectric layer 302, the first current blocking layer 303 and the second dielectric layer 304 sequentially stacked. The first current blocking layer 303 can reduce the leakage current in the first dielectric layer 302, and a capacitor to be formed subsequently includes the first current blocking layer 303, thereby improving the electrical performance of the capacitor.

In this embodiment, the dielectric constant of the material of the second dielectric layer 304 is greater than the dielectric constant of the material of the first dielectric layer 302, and the dielectric layer 16 of the capacitor formed subsequently (refer to FIG. 15) includes the first dielectric layer 302 and the second dielectric layer 304, which increase the capacitance of the capacitor.

In this embodiment, the second dielectric layer 304 is made of titanium oxide. The dielectric constant of titanium oxide is 75-85, and it can be seen from the first embodiment that the dielectric constant of the first dielectric layer 302 is 40-60. Therefore, when the second dielectric layer 304 is made of titanium oxide, the dielectric constant of the second dielectric layer 304 is much greater than the dielectric constant of the first dielectric layer 302, and the second dielectric layer 304 greatly increases the overall dielectric constant of the dielectric layer 16 (refer to FIG. 7).

The second dielectric layer 304 is formed by an ALD process, a CVD process or a PVD process. In an example, the second dielectric layer 304 is formed by the ALD process, and a process temperature of the ALD process is 200° C.-700° C.

In other embodiments, the material of the second dielectric layer may be at least one of the group consisting of titanium oxide, barium oxide and lanthanum lutetium oxide.

In another example, referring to FIG. 11, after the first current blocking layer 303 and the second dielectric layer 304 are sequentially formed on the first dielectric layer 302, the manufacturing method further includes: deposit a second current blocking layer 305 on a surface of the second dielectric layer 304. The second current blocking layer 305 has low conductivity, which reduces the leakage current in the second dielectric layer 304 and the first dielectric layer 302. The dielectric layer 16 of the capacitor formed subsequently further includes the second current blocking layer 305, which further increases the capacitance of the capacitor, thereby improving the electrical performance of the semiconductor structure.

In this embodiment, after forming the second current blocking layer, a top electrode layer may be directly formed on the second current blocking layer to form the capacitor. In other embodiments, after forming the second current blocking layer, the dielectric layer may be formed on the second current blocking layer, and then the top electrode layer may be directly formed on the dielectric layer to form the capacitor.

In this embodiment, the second dielectric layer 304 is further formed on the first dielectric layer 302, and the dielectric constant of the material of the second dielectric layer 304 is greater than the dielectric constant of the material of the first dielectric layer 302. Therefore, the dielectric layer 16 of the capacitor formed subsequently has a stacked structure including the first dielectric layer 302 and the second dielectric layer 304, which improves the structural stability of the capacitor and further increases the capacitance of the capacitor.

A fourth embodiment of the present disclosure further provides a semiconductor structure. The semiconductor structure is manufactured by the manufacturing method provided by any one of the above embodiments.

Referring to FIG. 3, the semiconductor structure includes: a base 100; a bottom electrode layer 101, a first dielectric layer 102 and a first current blocking layer 103. The bottom electrode layer 101 is located on the base 100, and a crystal structure of the bottom electrode layer 101 includes a tetragonal crystal system. The first dielectric layer 102 is located on a surface of the bottom electrode layer 101, and a crystal structure of the first dielectric layer 102 includes a tetragonal crystal system, which increases the dielectric constant of the first dielectric layer 102. The first current blocking layer 103 is located on a surface of the first dielectric layer 102, which reduces the leakage current in the first dielectric layer 102. Further, a dielectric layer 16 is configured to form a capacitor in the semiconductor structure, and the dielectric layer 16 includes the first dielectric layer 102 and the first current blocking layer 103, which increases the capacitance of a capacitor to be formed, thereby improving the electrical performance of the semiconductor structure.

In a direction perpendicular to a surface of the base 100, the thickness of the first dielectric layer is 0.1-10 nm, for example, 0.5 nm, 4 nm or 8 nm. A material of the first dielectric layer 102 includes at least one of dielectric materials of tantalum oxide, hafnium oxide, zirconium oxide, niobium oxide, titanium oxide, barium oxide, strontium oxide, yttrium oxide, lanthanum oxide, praseodymium oxide or barium strontium titanate.

In this embodiment, referring to FIG. 6, the base 100 includes: a substrate 11; an intermediate support layer 13 and a top support layer 15. The intermediate support layer 13 is located above the substrate 11 and is spaced apart from the substrate 11. The top support layer 15 is located above the intermediate support layer 13 and is spaced apart from the intermediate support layer 13. In a direction perpendicular to the substrate 11, the thickness of the intermediate support layer 13 is 10-50 nm, and the thickness of the top support layer 15 is 10-100 nm.

The material of the intermediate support layer 13 includes at least one of the group consisting of silicon nitride and silicon carbonitride, and the material of the top support layer 15 is the same as the material of the intermediate support layer 13. In other embodiments, the material of the top support layer 15 and the material of the intermediate support layer 13 may also be different.

Referring to FIG. 6, the bottom and a sidewall of the bottom electrode layer 101 enclose a through hole, and the bottom of the through hole abuts against the substrate 11. The intermediate support layer 13 and the top support layer 15 respectively abut against part of the bottom electrode layer 101 away from the sidewall of the through hole.

Referring to FIG. 7, the dielectric layer 16 conformally covers a surface of a structure formed by the bottom electrode layer 101, the intermediate support layer 13 and the top support layer 15. The dielectric layer 16 includes at least the first dielectric layer 102. FIG. 6 only actually illustrates one type of base 100. In fact, there may be more types of bases for forming the bottom electrode layer on the base, so as to facilitate the subsequent formation of the capacitor with the dielectric layer 16 on the base.

The specific composition and structure of the dielectric layer 16 (refer to FIG. 7) in the semiconductor structure will be described below with reference to FIGS. 3, 9 and 11.

Example 1: Referring to FIG. 3, the dielectric layer 16 further includes: a first current blocking layer 103. The first current blocking layer 103 is located on the surface of the first dielectric layer 102. It increases the dielectric constant of the capacitor in the semiconductor structure and reduces the leakage current in the capacitor, so as to further increase the capacitance of the capacitor and improve the electrical performance of the semiconductor structure. The dielectric layer 16 is formed by sequentially stacking the first dielectric layer 102 and the first current blocking layer 103.

Example 2: Referring to FIG. 9, the dielectric layer 16 further includes: a first current blocking layer 203, a second dielectric layer 204 and a second current blocking layer 205. The first current blocking layer 203 is located on a surface of the first dielectric layer 202. The second dielectric layer 204 is located on a surface of the first current blocking layer 203, and a crystal structure of the second dielectric layer 204 includes a tetragonal crystal system. The second current blocking layer 205 is located on a surface of the second dielectric layer 204. Further, the material of the second dielectric layer 204 includes zirconium oxide.

In this embodiment, the crystal structure of the second dielectric layer 204 is tetragonal, which increases the dielectric constant of the capacitor in the semiconductor structure. Meanwhile, the first current blocking layer 203 reduces the leakage current in the first dielectric layer 202, and the second current blocking layer 205 reduces the leakage current in the second dielectric layer 204, thereby improving the electrical performance of the semiconductor structure. The dielectric layer 16 is formed by sequentially stacking the first dielectric layer 202, the first current blocking layer 203, the second dielectric layer 204 and the second current blocking layer 205.

Example 3: Referring to FIG. 11, the dielectric layer 16 further includes: a first current blocking layer 303, a second dielectric layer 304 and a second current blocking layer 305. The first current blocking layer 303 is located on a surface of the first dielectric layer 302. The second dielectric layer 304 is located on a surface of the first current blocking layer 303, and the dielectric constant of the material of the second dielectric layer 304 is greater than the dielectric constant of the material of the first dielectric layer 302. The second current blocking layer 305 is located on a surface of the second dielectric layer 304. The dielectric layer 16 is formed by sequentially stacking the first dielectric layer 302, the first current blocking layer 303, the second dielectric layer 304 and the second current blocking layer 305.

The material of the second dielectric layer 304 includes at least one of the group consisting of titanium oxide, barium oxide and lanthanum lutetium oxide. The dielectric constant of the material of the second dielectric layer 304 is greater than the dielectric constant of the material of the first dielectric layer 302, which further increases the dielectric constant of the capacitor, thereby improving the electrical performance of the semiconductor structure.

In Examples 1 to 3, the material of the first current blocking layer includes at least one of the group consisting of aluminum oxide, silicon oxide and silicon nitride. In a direction perpendicular to the surface of the base, the thickness of the first current blocking layer is 0.1-5 nm, for example, 0.5 nm, 2 nm or 4 nm.

In Examples 2 and 3, in the direction perpendicular to the surface of the base, the thickness of the second dielectric layer is 0.1-10 nm, for example, 0.5 nm, 4 nm or 8 nm; and the thickness of the second current blocking layer is 0.1-5 nm, for example, 0.5 nm, 2 nm or 4 nm. By controlling the thickness of the second dielectric layer and the second current blocking layer within the above range, the electrical performance of the semiconductor structure is improved while the size of the capacitor is reduced.

In this embodiment, the crystal structure of the first dielectric layer is tetragonal, which increases the dielectric constant of the first dielectric layer. The dielectric layer configured to form the capacitor includes at least the first dielectric layer with a tetragonal crystal structure, which increases the capacitance of the capacitor.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It should be understood that the terms such as "first" and "second" used herein may be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and the manufacturing method thereof provided by the embodiments of the present disclosure, the dielectric constant of the first dielectric layer is increased, and the leakage current in the first dielectric layer is reduced through the first current blocking layer. Thus, the capacitance of the capacitor to be formed subsequently is increased, thereby improving the electrical performance of the semiconductor structure.

The invention claimed is:

1. A method of manufacturing a semiconductor structure, comprising:
 providing a base;
 forming a bottom electrode layer on the base, wherein a crystal structure of the bottom electrode layer comprises a tetragonal crystal system;
 forming a first dielectric layer on a surface of the bottom electrode layer by using the bottom electrode layer as a seed layer, wherein a crystal structure of the first dielectric layer comprises a tetragonal crystal system;
 forming a first current blocking layer on a surface of the first dielectric layer; and
 forming a second dielectric layer on the first current blocking layer; and depositing a second current blocking layer on a surface of the second dielectric layer, wherein a temperature of the depositing is greater than or equal to a crystallization temperature for a crystal structure of the second dielectric layer to be transformed into a tetragonal crystal system.

2. The method of manufacturing a semiconductor structure according to claim 1, wherein the bottom electrode layer is formed by an atomic layer deposition process, and a temperature parameter of the atomic layer deposition process is 280° C.-400° C.

3. The method of manufacturing a semiconductor structure according to claim 1, wherein the first dielectric layer is formed by an epitaxial process.

4. The method of manufacturing a semiconductor structure according to claim 3, wherein a material of the first dielectric layer is hafnium oxide, and a process temperature of the epitaxial process is 250° C.-600° C.

5. The method of manufacturing a semiconductor structure according to claim 1, further comprising:
 forming a second dielectric layer on the first current blocking layer, wherein a dielectric constant of a material of the second dielectric layer is greater than a dielectric constant of a material of the first dielectric layer.

6. The method of manufacturing a semiconductor structure according to claim 5, wherein the material of the second dielectric layer comprises titanium oxide.

7. The method of manufacturing a semiconductor structure according to claim 1, wherein after forming the second current blocking layer, a material of the second dielectric layer comprises tetragonal zirconium oxide, and a material of the second current blocking layer comprises aluminum oxide.

8. The method of manufacturing a semiconductor structure according to claim 7, wherein a process temperature of the depositing is 200° C.-700° C.

9. The method of manufacturing a semiconductor structure according to claim 1, wherein a material of the first dielectric layer comprises at least one of dielectric materials of tantalum oxide, hafnium oxide, zirconium oxide, niobium oxide, titanium oxide, barium oxide, strontium oxide, yttrium oxide, lanthanum oxide, praseodymium oxide or barium strontium titanate.

10. The method of manufacturing a semiconductor structure according to claim 1, wherein the providing a base and the forming a bottom electrode layer on the base comprise:

providing a substrate, and forming a first sacrificial layer, an intermediate support layer, a second sacrificial layer and a top support layer sequentially stacked on the substrate;

patterning the top support layer, the second sacrificial layer, the intermediate support layer, the first sacrificial layer and the substrate, to form a capacitor hole, the capacitor hole penetrating the top support layer, the second sacrificial layer, the intermediate support layer, the first sacrificial layer and part of the substrate, wherein the capacitor hole exposes the substrate;

forming a base bottom electrode layer on a bottom and a sidewall of the capacitor hole; and removing part of the top support layer, part of the intermediate support layer, part of the base bottom electrode layer, the first sacrificial layer and the second sacrificial layer, to form the base and form the bottom electrode layer on the base.

* * * * *